US010825764B2

(12) United States Patent
Carney et al.

(10) Patent No.: US 10,825,764 B2
(45) Date of Patent: *Nov. 3, 2020

(54) SEMICONDUCTOR DEVICE AND METHOD OF FORMING MICRO INTERCONNECT STRUCTURES

(71) Applicant: SEMICONDUCTOR COMPONENTS INDUSTRIES, LLC, Phoenix, AZ (US)

(72) Inventors: Francis J. Carney, Mesa, AZ (US); Jefferson W. Hall, Chandler, AZ (US); Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 69 days.

This patent is subject to a terminal disclaimer.

(21) Appl. No.: 16/131,462

(22) Filed: Sep. 14, 2018

(65) Prior Publication Data

US 2019/0013265 A1 Jan. 10, 2019

Related U.S. Application Data

(63) Continuation of application No. 15/218,974, filed on Jul. 25, 2016, now Pat. No. 10,090,233.

(Continued)

(51) Int. Cl.
*H01L 23/498* (2006.01)
*H01L 21/48* (2006.01)

(Continued)

(52) U.S. Cl.
CPC .. *H01L 23/49827* (2013.01); *H01L 21/02035* (2013.01); *H01L 21/288* (2013.01);

(Continued)

(58) Field of Classification Search
CPC ........... H01L 21/4853; H01L 23/49866; H01L 23/49811; H01L 23/49827
See application file for complete search history.

(56) References Cited

U.S. PATENT DOCUMENTS

| | | | | |
|---|---|---|---|---|
| 5,544,017 | A | 8/1996 | Beilin et al. | |
| 7,608,919 | B1 * | 10/2009 | Bernstein | H01L 23/60 257/685 |

(Continued)

OTHER PUBLICATIONS

Kulick et al., Jason, "Indiana Integrated Circuits, LLC and Quilt Packaging® Technology: An Overview," Indiana Integrated Circuits, LLC, May 2016, 42 pages.

*Primary Examiner* — Dale E Page
*Assistant Examiner* — Wilner Jean Baptiste
(74) *Attorney, Agent, or Firm* — Adam R. Stephenson, Ltd.

(57) ABSTRACT

A semiconductor device has a first semiconductor die and second semiconductor die with a conductive layer formed over the first semiconductor die and second semiconductor die. The second semiconductor die is disposed adjacent to the first semiconductor die with a side surface and the conductive layer of the first semiconductor die contacting a side surface and the conductive layer of the second semiconductor die. An interconnect, such as a conductive material, is formed across a junction between the conductive layers of the first and second semiconductor die. The conductive layer may extend down the side surface of the first semiconductor die and further down the side surface of the second semiconductor die. An extension of the side surface of the first semiconductor die can interlock with a recess of the side surface of the second semiconductor die. The conductive layer extends over the extension and into the recess.

8 Claims, 10 Drawing Sheets

Related U.S. Application Data

(60) Provisional application No. 62/219,666, filed on Sep. 17, 2015.

(51) Int. Cl.

| | |
|---|---|
| ***H01L 23/00*** | (2006.01) |
| ***H01L 21/3065*** | (2006.01) |
| ***H01L 21/78*** | (2006.01) |
| ***H01L 23/495*** | (2006.01) |
| ***H01L 21/67*** | (2006.01) |
| ***H01L 21/66*** | (2006.01) |
| ***H01L 21/56*** | (2006.01) |
| ***H01L 23/31*** | (2006.01) |
| ***H02M 3/158*** | (2006.01) |
| ***H01L 23/482*** | (2006.01) |
| ***H01L 25/065*** | (2006.01) |
| ***H01L 25/00*** | (2006.01) |
| ***H01L 23/544*** | (2006.01) |
| ***H01L 21/02*** | (2006.01) |
| ***H01L 21/304*** | (2006.01) |
| ***H01L 21/308*** | (2006.01) |
| ***H01L 27/146*** | (2006.01) |
| ***H01L 21/288*** | (2006.01) |
| ***H01L 21/683*** | (2006.01) |
| ***H01L 21/768*** | (2006.01) |
| ***H01L 23/48*** | (2006.01) |
| ***H01L 27/02*** | (2006.01) |
| ***H01L 27/088*** | (2006.01) |
| ***H01L 27/14*** | (2006.01) |
| ***H01L 29/08*** | (2006.01) |
| *H01L 23/15* | (2006.01) |
| *H01L 23/367* | (2006.01) |
| *H01L 23/14* | (2006.01) |

(52) U.S. Cl.

CPC .......... *H01L 21/304* (2013.01); *H01L 21/308* (2013.01); *H01L 21/3065* (2013.01); *H01L 21/3083* (2013.01); *H01L 21/486* (2013.01); *H01L 21/4825* (2013.01); *H01L 21/4853* (2013.01); *H01L 21/565* (2013.01); *H01L 21/67069* (2013.01); *H01L 21/6835* (2013.01); *H01L 21/76877* (2013.01); *H01L 21/76898* (2013.01); *H01L 21/78* (2013.01); *H01L 22/12* (2013.01); *H01L 22/26* (2013.01); *H01L 23/3107* (2013.01); *H01L 23/3114* (2013.01); *H01L 23/481* (2013.01); *H01L 23/4822* (2013.01); *H01L 23/4951* (2013.01); *H01L 23/49503* (2013.01); *H01L 23/49541* (2013.01); *H01L 23/49562* (2013.01); *H01L 23/49575* (2013.01); *H01L 23/49811* (2013.01); *H01L 23/49838* (2013.01); *H01L 23/49866* (2013.01); *H01L 23/544* (2013.01); *H01L 23/562* (2013.01); *H01L 24/00* (2013.01); *H01L 24/05* (2013.01); *H01L 25/0655* (2013.01); *H01L 25/0657* (2013.01); *H01L 25/50* (2013.01); *H01L 27/0207* (2013.01); *H01L 27/088* (2013.01); *H01L 27/14* (2013.01); *H01L 27/14683* (2013.01); *H01L 29/0847* (2013.01); *H02M 3/158* (2013.01); *H01L 23/147* (2013.01); *H01L 23/15* (2013.01); *H01L 23/3677* (2013.01); *H01L 23/49816* (2013.01); *H01L 27/14625* (2013.01); *H01L 27/14685* (2013.01); *H01L 2221/68327* (2013.01); *H01L 2223/5446* (2013.01); *H01L 2223/54426* (2013.01); *H01L 2224/0401* (2013.01); *H01L 2224/04042* (2013.01); *H01L 2224/05083* (2013.01); *H01L 2224/05084* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05172* (2013.01); *H01L 2224/05184* (2013.01); *H01L 2224/13025* (2013.01); *H01L 2224/13111* (2013.01); *H01L 2224/13116* (2013.01); *H01L 2225/06555* (2013.01); *H01L 2225/06593* (2013.01); *H01L 2225/06596* (2013.01); *H01L 2924/13055* (2013.01); *H01L 2924/13091* (2013.01); *H01L 2924/3511* (2013.01)

(56) References Cited

U.S. PATENT DOCUMENTS

| | | | |
|---|---|---|---|
| 8,670,246 | B2 | 3/2014 | Ellis |
| 9,633,976 | B1 | 4/2017 | Bernstein et al. |
| 10,090,233 | B2 * | 10/2018 | Carney ............. H01L 23/49562 |
| 2003/0080422 | A1 | 5/2003 | Ohara |
| 2005/0051903 | A1 | 3/2005 | Ellsberry et al. |
| 2006/0148250 | A1 | 7/2006 | Kirby |
| 2012/0094469 | A1 | 4/2012 | Landru |
| 2012/0129276 | A1 | 5/2012 | Haensch et al. |
| 2012/0148250 | A1 | 6/2012 | Xu et al. |
| 2012/0273971 | A1 | 11/2012 | Usami |
| 2016/0043054 | A1 | 2/2016 | Fischer et al. |
| 2016/0240510 | A1 | 8/2016 | Lien et al. |
| 2017/0179093 | A1 | 6/2017 | Hall et al. |

* cited by examiner

SEMICONDUCTOR DEVICE AND METHOD OF FORMING MICRO INTERCONNECT STRUCTURES

CROSS-REFERENCE TO RELATED APPLICATIONS

The present application claims the benefit of U.S. Provisional Application No. 62/219,666, filed Sep. 17, 2015, entitled "SEMICONDUCTOR PACKAGES AND METHODS" to Francis J. CARNEY and Michael J. SEDDON, and which is incorporated herein by reference and priority thereto for common subject matter is hereby claimed.

This application is also a continuation application of the earlier U.S. Utility Patent Application to Carney et al. entitled "Semiconductor Device and Method of Forming Micro Interconnect Structures," application Ser. No. 15/218,974, filed Jun. 25, 2016, the disclosure of which is hereby incorporated entirely herein by reference.

TECHNICAL FIELD

The present disclosure relates in general to semiconductor devices and, more particularly, to a semiconductor device and method of forming micro interconnect structures.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), standard logic, amplifiers, clock management, memory, interface circuits, and various signal processing circuits.

An important aspect of semiconductor devices is the area required for interconnect structures between semiconductor die. FIG. 1 shows a known inter-die interconnect arrangement with semiconductor die 50 disposed adjacent to, but separated from, semiconductor die 52. Bond wire 54 provides electrical interconnect between contact pad 56 on active surface 58 of semiconductor die 50 and contact pad 60 on active surface 62 of semiconductor die 52. Bond wire 54 requires separation of distance D1 between semiconductor die 50 and 52, as well as dedicated edge space D2 in order to form and shape the bond wire. In addition, semiconductor die often reserve dedicated edge space for the scribe grid to account for saw variation, crack stop trench to account for crack propagation from the saw street, or die edge seal to account for saw cracks and eventually moisture from entering near the active area. The die edge space requirements remain a problem. It is desirable to reduce dedicated edge space required for electric interconnect in order to maximize the active die area providing signal processing functions for a given semiconductor package, as well as reduce the overall footprint of the semiconductor package.

Die stacking has been used to minimize semiconductor package footprint and is useful for low power technologies, such as memory devices. However, heat dissipation and excessive stress have been problems with stacked die, particularly for power MOSFETs and integrated drivers. Another common approach for inter-die interconnect is to use through silicon vias (TSVs), which are costly to manufacture.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2A:
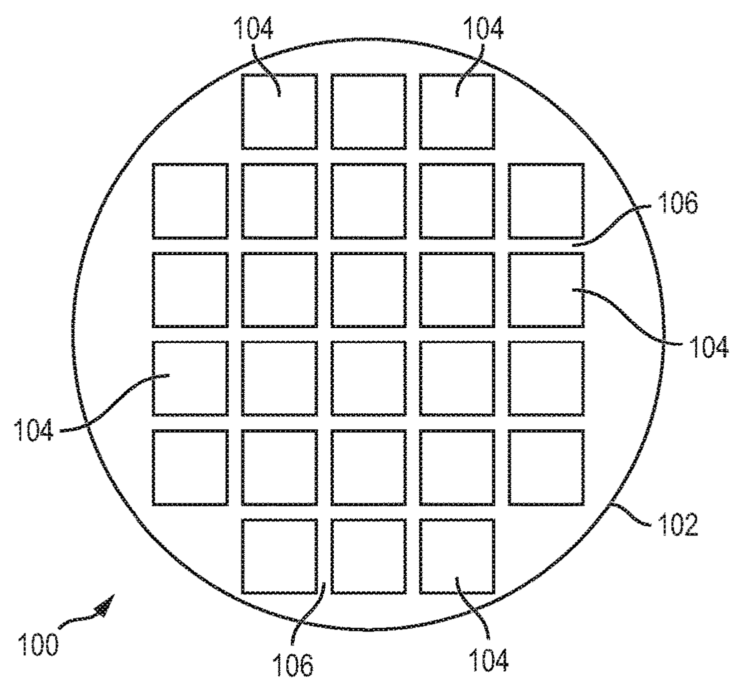
FIGS. 2*a*-2*d* illustrate a semiconductor wafer with a plurality of semiconductor die separated by a saw street.

FIG. 2*a* shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die or components 104 is formed on wafer 100 separated by a non-active, inter-die wafer area or saw street 106, as described above. Saw street 106 provides cutting areas to singulate semiconductor wafer 100 into individual semiconductor die 104. In one embodiment, semiconductor wafer 100 has a width or diameter of 100-450 millimeters (mm) and thickness of 50-100 micrometers (μm) or 15-250 μm.

Figure 2B:
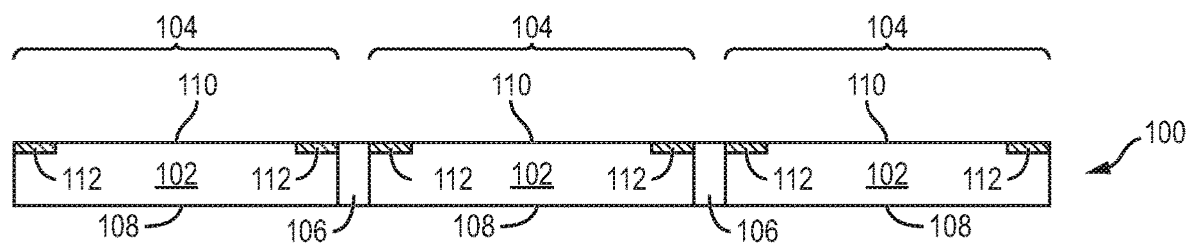

FIG. 2*b* shows a cross-sectional view of a portion of semiconductor wafer 100. Each semiconductor die 104 has a back or non-active surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), microcontrollers, ASIC, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as inter-die contact pads electrically connected to the circuits on active surface 110. In one embodiment, conductive layer 112 is formed at or near the edge of semiconductor die 104.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, or metallurgical microscope. Semiconductor wafer 100 is inspected for structural characteristics including warpage, thickness variation, surface particulates, irregularities, cracks, delamination, and discoloration.

Figure 2C:
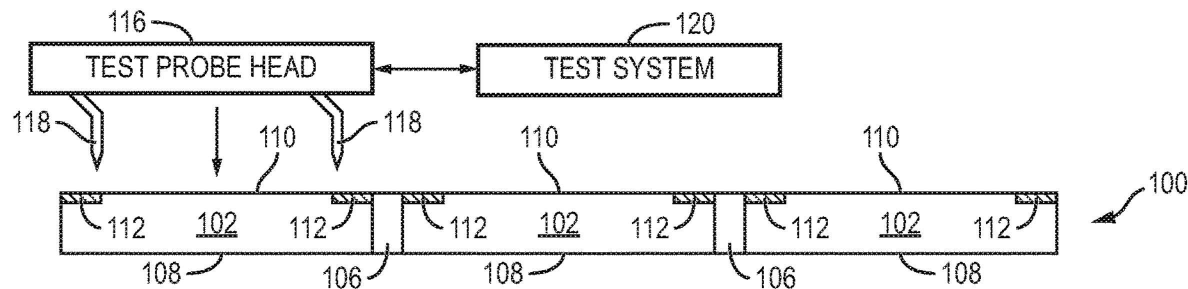

The active and passive components within semiconductor die 104 undergo testing at the wafer level for electrical performance and circuit function. Each semiconductor die 104 is tested for functionality and electrical parameters, as shown in FIG. 2*c*, using a test probe head 116 including a plurality of probes or test leads 118, or other testing device. Probes 118 are used to make electrical contact with nodes or conductive layer 112 on each semiconductor die 104 and provide electrical stimuli to contact pads 112. Semiconductor die 104 responds to the electrical stimuli, which is measured by computer test system 120 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die (KGD) for use in a semiconductor package.

Figure 2D:
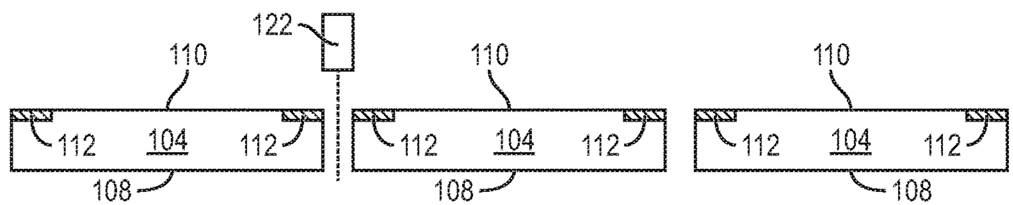

In FIG. 2*d*, semiconductor wafer 100 is singulated through saw street 106 into individual semiconductor die 104 using plasma etching. Plasma etching has advantages of forming precision side surfaces of semiconductor die 104, while retaining the structure and integrity of the base substrate material. Alternatively, semiconductor wafer 100 is singulated through saw street 106 using a saw blade or laser cutting tool 122 into individual semiconductor die 104. The individual semiconductor die 104 can be inspected and electrically tested for identification of KGD post singulation.

Figure 3A:
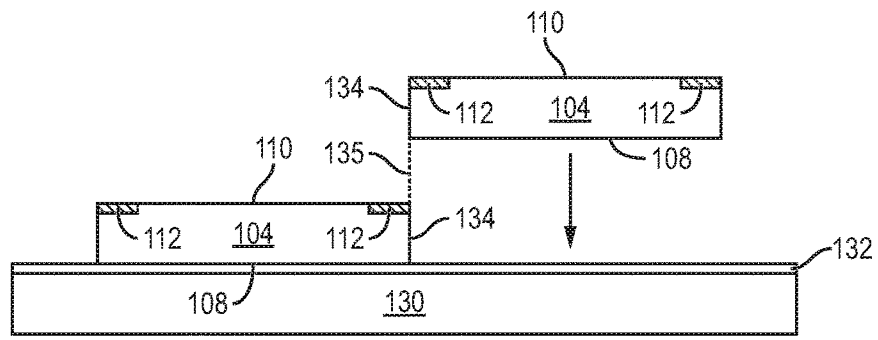
FIGS. 3*a*-3*d* illustrate a process of forming an inter-die interconnect between adjacent semiconductor die having contacting side surfaces.

FIGS. 3*a*-3*d* illustrate a process of forming an inter-die interconnect arrangement between side-by-side semiconductor die with contacting side surfaces. FIG. 3*a* shows a cross-sectional view of a portion of a carrier or temporary substrate 130 containing sacrificial base material such as silicon, polymer, beryllium oxide, glass, or other suitable low-cost, rigid material for structural support. Substrate 130 can also be a leadframe, ultraviolet (UV) or non-UV tape, tape mounted to a film frame, interposer, board, or stiff tape. An interface layer or double-sided tape 132 is formed over substrate 130 as a temporary adhesive bonding film, etch-stop layer, or thermal release layer.

Figure 3B:
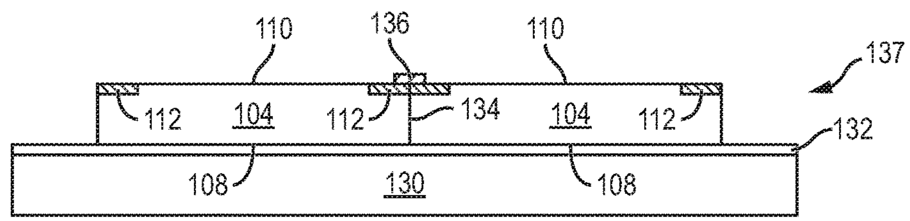

Semiconductor die 104 from FIGS. 2*a*-2*d* are mounted to substrate 130 using a pick and place operation with back surface 108 oriented toward the substrate and side surfaces 134 of base substrate material 102 of side-by-side semiconductor die 104 aligned at 135. FIG. 3*b* shows semiconductor die 104 mounted to substrate 130 to implement reconstituted or reconfigured wafer 137. In particular, side surface 134 of base substrate material 102 of semiconductor die 104*a* is in direct physical contact with side surface 134 of base substrate material 102 of semiconductor die 104*b*. In general, side surfaces 134 of semiconductor die 104 make contact with the side surface of the side-by-side semiconductor die 104. Alternatively, the side-by-side semiconductor die 104 have negligible separation of less than 20 micrometers (μm), or less than 5 μm.

An electrically conductive layer 136 is formed to overlap conductive layers 112 of semiconductor die 104*a*-104*b* using PVD, CVD, electrolytic plating, electroless plating process, or other suitable metal deposition process. In one embodiment, conductive layer 136 is formed across conductive layer 112 of semiconductor die 104*a* and conductive layer 112 of semiconductor die 104*b* using plasma enhanced chemical vapor deposition (PeCVD) processes. Conductive layer 136 can be one or more layers of Al, Cu, Sn, Ni, Au, Ag, Ti, TiW, or other suitable electrically conductive material. Conductive layer 136 can also be an anisotropic conductive film (ACF). Conductive layer 136 provides electrical interconnect of conductive layer 112 of semiconductor die 104*a* and conductive layer 112 of semiconductor die 104*b*, which are disposed side-by-side with side surfaces 134 in physical contact with each other. Conductive layer 112 may contain plated solder and flux material. Conductive layers 112 of semiconductor die 104*a*-104*b* are electrically connected upon reflow of the solder.

Figure 3C:
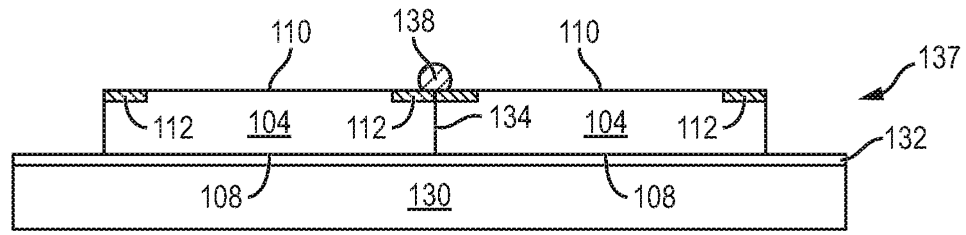

Alternatively, an electrically conductive material is deposited over the junction between conductive layer 112 of semiconductor die 104*a* and conductive layer 112 of semiconductor die 104*b*, using an evaporation, electrolytic plating, electroless plating, ball drop, or screen printing process, see FIG. 3*c*. The conductive material can be Al, Sn, Ni, Au, Ag, Pb, Bi, Cu, solder, and combinations thereof, with an optional flux solution. For example, the conductive material can be eutectic Sn/Pb, high-lead solder, or lead-free solder. The conductive material is bonded to conductive layers 112 of semiconductor die 104*a*-104*b* using a suitable attachment or bonding process. In one embodiment, the conductive material is reflowed by heating the material above its melting point to form interconnects 138. In some applications, interconnects 138 are reflowed a second time to improve electrical contact to conductive layers 112. Interconnects 138 can also be compression bonded or thermocompression bonded to conductive layers 112. The conductive material can be conductive epoxy that is cured using UV light or heat. Note that a single interconnect 138 provides electrical interconnection between conductive layers 112 on semiconductor die 104*a*-104*b*.

Figure 3D:
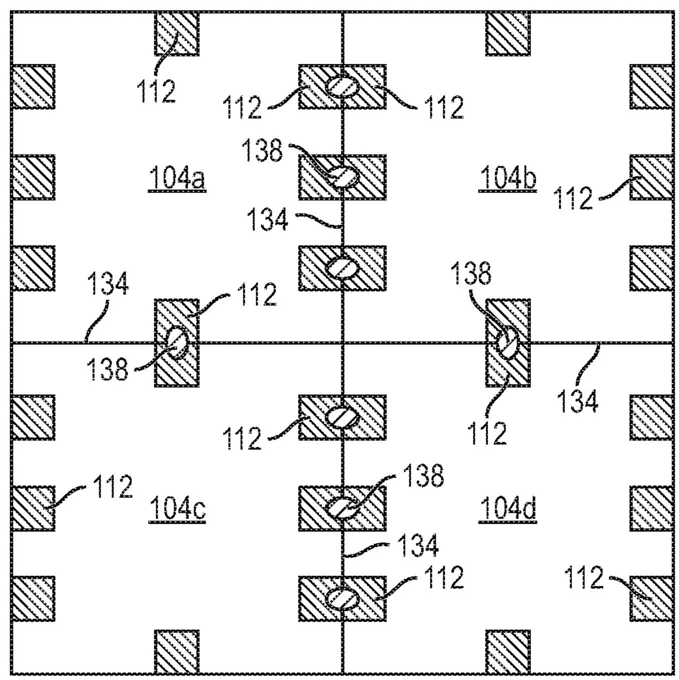

FIG. 3*d* illustrates a top view of semiconductor die 104*a*-104*d* with side surfaces 134 of each semiconductor die in direct physical contact with the side surface of the mating semiconductor die. Side surfaces 134 of base substrate material 102 of semiconductor die 104*a* contact side surfaces 134 of base substrate material 102 of semiconductor die 104*b* and 104*c*. Side surfaces 134 of base substrate material 102 of semiconductor die 104*d* contact side surfaces 134 of base substrate material 102 of semiconductor die 104*b* and 104*c*.

Interconnect 138 is formed across conductive layer 112 of semiconductor die 104*a* and conductive layer 112 of semiconductor die 104*b* to make electrical interconnect between the semiconductor die. Interconnect 138 is formed across conductive layer 112 of semiconductor die 104*a* and conductive layer 112 of semiconductor die 104*c* to make electrical interconnect between the semiconductor die. Interconnect 138 is formed across conductive layer 112 of semiconductor die 104*b* and conductive layer 112 of semiconductor die 104*d* to make electrical interconnect between the semiconductor die. Interconnect 138 is formed across conductive layer 112 of semiconductor die 104*c* and conductive layer 112 of semiconductor die 104*d* to make electrical interconnect between the semiconductor die. Interconnect 138 represent one type of interconnect that can be formed across conductive layers 112. The direct contact, or negligible separation, between side surfaces 134 of semiconductor die 104*a*-104*d* allow for small inter-die interconnects between conductive layers 112 of semiconductor die 104*a*-104*d*, such as conductive paste, micro bump, printed solder, wire bond, sputtered film, evaporated film, conductive epoxy, ACF, or other minimal electrical interconnect. A single interconnect 138 provides electrical interconnection between conductive layers 112 on semiconductor die 104*a*-104*d*.

Figure 1:
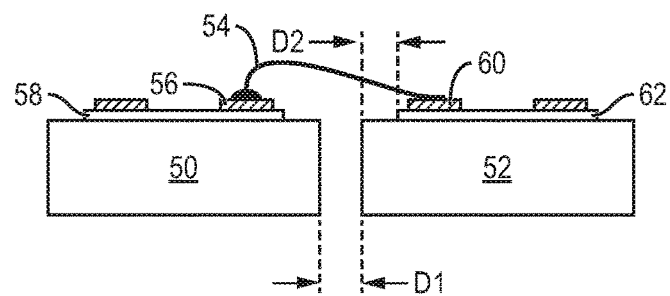
FIG. 1 illustrates a common wire bond interconnect structure between adjacent semiconductor die.

The inter-die interconnect arrangement reduces semiconductor package dimensions and cost, and can be applied to most, if not all, semiconductor materials. The rectangular package area with semiconductor die 104*a*-104*b* contacting in an interlocking configuration increases the efficiency of the footprint or total usable area of the semiconductor package. The inductance and resistance is low compared to wire bonding between separate semiconductor die as described in FIG. 1.

Figure 4A:
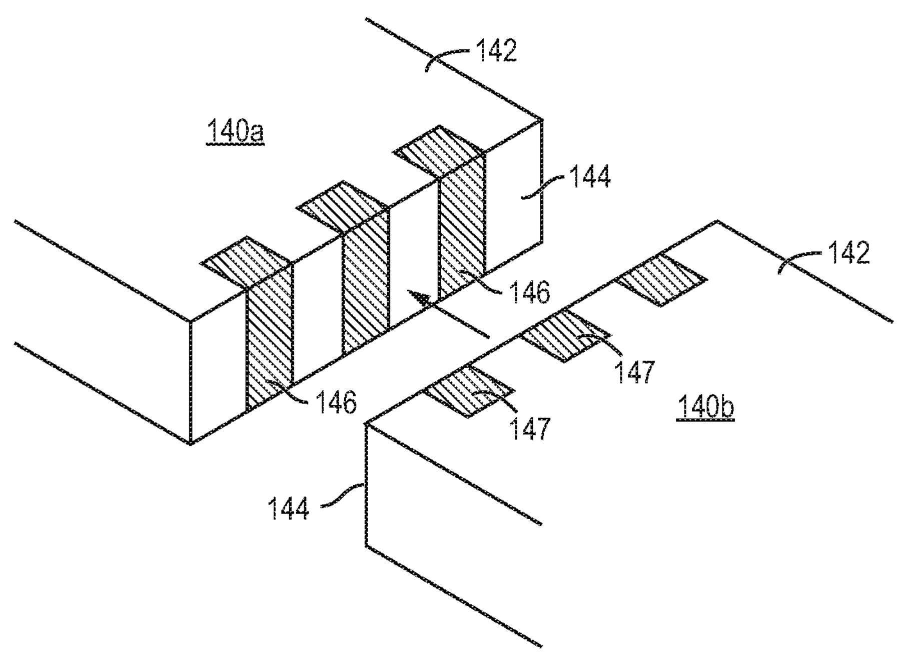
FIGS. 4*a*-4*b* illustrate forming the conductive layer vertically down the side surfaces of the semiconductor die.
Figure 4B:
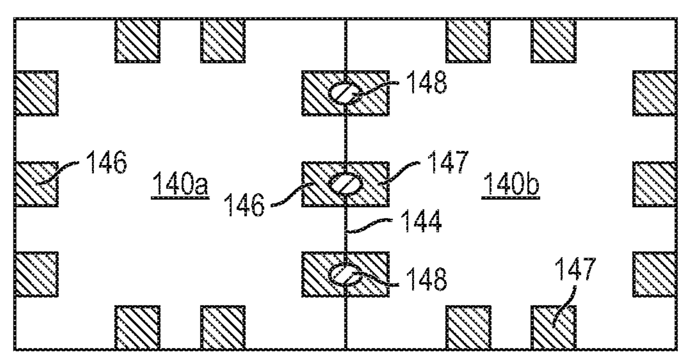

FIGS. 4*a*-4*b* illustrate another process of forming an inter-die interconnect arrangement between side-by-side semiconductor die. FIG. 4*a* shows an orthogonal view of semiconductor die or substrates 140*a* and 140*b* with active surface 142 and side surfaces 144, similar to semiconductor die 104 singulated from semiconductor wafer 100. An electrically conductive layer 146 is formed over active surface 142 and side surfaces 144 of semiconductor die 140*a* using PVD, CVD, electrolytic plating, electroless plating process, or other suitable metal deposition process. Likewise, an electrically conductive layer 147 is formed over active surface 142 and side surfaces 144 of semiconductor die 140*b* using PVD, CVD, electrolytic plating, electroless plating process, or other suitable metal deposition process. Conductive layers 146 and 147 can be one or more layers of Al, Cu, Sn, Ni, Au, Ag, Ti, TiW, or other suitable electrically conductive material. Conductive layers 146-147 operate as inter-die contact areas electrically connected to the circuits on active surfaces 142 on semiconductor die 140*a*-140*b*, respectively.

Semiconductor die 140*a*-140*b* are brought together using a pick and place operation. FIG. 4*b* shows a top view of side surface 144 of the base substrate material of semiconductor die 140*a* in direct physical contact with side surface 144 of the base substrate material of semiconductor die 140*b*. Conductive layer 146 on side surface 144 of semiconductor die 140*a* are aligned to make electrical contact with conductive layer 147 on side surface 144 of semiconductor die 140*b* for greater contact surface area. In general, side surfaces 144 of each semiconductor die 140 make contact with the side surface of another side-by-side semiconductor die 140 with conductive layer 146 making electrical connection with conductive layer 147 to provide greater contact surface area.

An electrically conductive material is deposited over the junction between conductive layer 146 of semiconductor die 140*a* and conductive layer 147 of semiconductor die 140*b*, using an evaporation, electrolytic plating, electroless plating, ball drop, or screen printing process. The conductive material can be Al, Sn, Ni, Au, Ag, Pb, Bi, Cu, solder, and combinations thereof, with an optional flux solution. For example, the conductive material can be eutectic Sn/Pb, high-lead solder, or lead-free solder. The conductive material is bonded to conductive layers 146-147 of semiconductor die 140*a*-140*b* using a suitable attachment or bonding process. In one embodiment, the conductive material is reflowed by heating the material above its melting point to form interconnects 148. In some applications, interconnects 148 are reflowed a second time to improve electrical contact to conductive layers 146-147. Interconnects 148 can also be compression bonded or thermo-compression bonded to conductive layers 146-147. The conductive material can be conductive epoxy that is cured using UV light or heat.

Interconnect 148 is formed across the junction between conductive layer 146 of semiconductor die 140*a* and conductive layer 147 of semiconductor die 140*b* to make electrical interconnect between the semiconductor die. During reflow, interconnect 148 may flow down conductive layers 146 and 147 on side surfaces 144 for a larger secure bond and to account for manufacturing tolerances. Interconnect 148 represent one type of interconnect that can be formed across conductive layers 146-147. The direct contact between side surfaces 144 of semiconductor die 140*a*-140*d* allow for small inter-die interconnects between conductive layers 146-147 of semiconductor die 140*a*-140*d*, such as conductive paste, micro bump, printed solder, wire bond, sputtered film, evaporated film, conductive epoxy, ACF, or other minimal electrical interconnect.

Figure 5A:
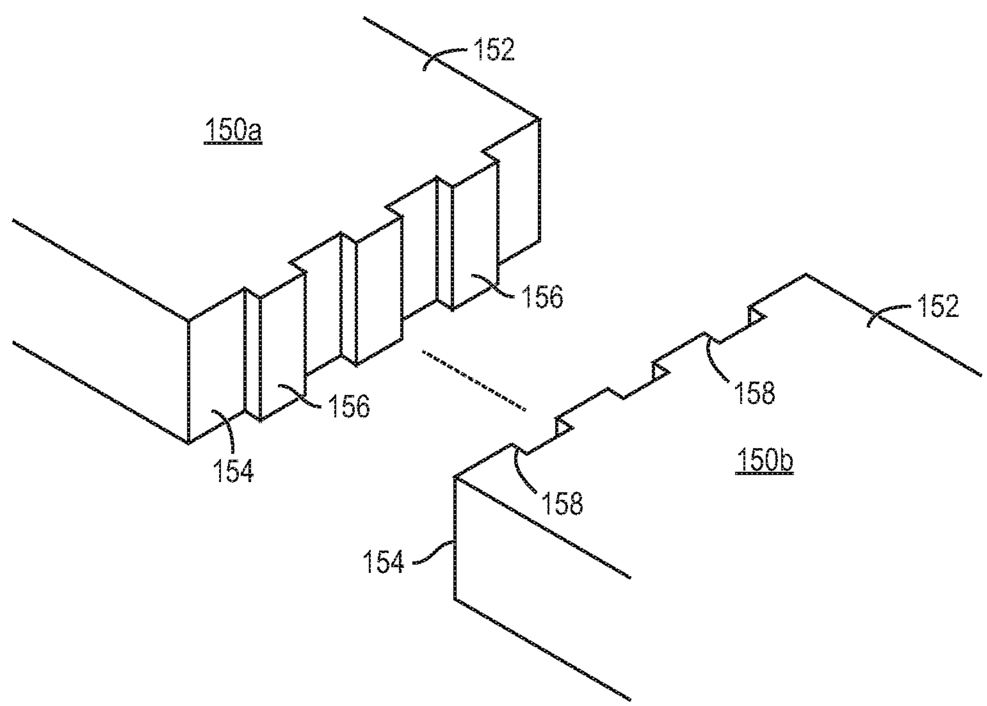
FIGS. 5*a*-5*c* illustrate forming conductive extensions and recesses on the side surfaces of the semiconductor die.
Figure 5B:
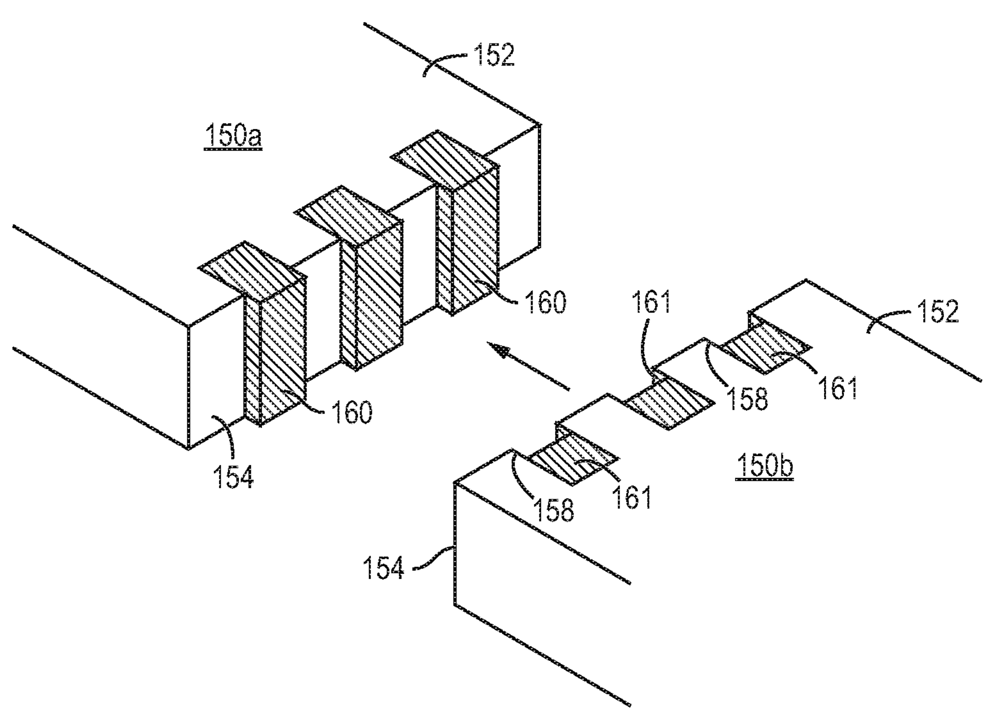
Figure 5C:
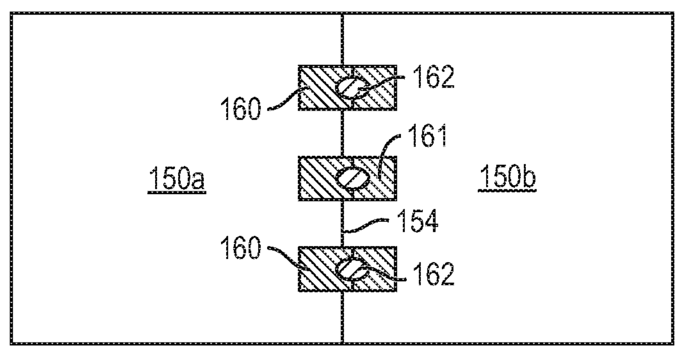

FIGS. 5*a*-5*c* illustrate another process of forming an inter-die interconnect arrangement between interlocked side-by-side semiconductor die. FIG. 5*a* shows an orthogonal view of semiconductor die or substrates 150*a* and 150*b* with active surface 152 and side surfaces 154, similar to semiconductor die 104 singulated from semiconductor wafer 100. Side surface 154 of semiconductor die 150*a* is plasma etched to form extensions 156, and side surface 154 of semiconductor die 150*b* is plasma etched to form recesses 158. The precision plasma etching allows extensions 156 and recesses 158 to be formed with dimensions capable of closely and securely interlocking together. Plasma etching forms precision side surfaces of semiconductor die 104 with extensions 156 and recesses 158, while retaining the structure and integrity of the base substrate material.

In FIG. 5*b*, an electrically conductive layer 160 is formed over active surface 152 and extensions 156 of side surfaces 154 of semiconductor die 150*a* using PVD, CVD, electrolytic plating, electroless plating process, or other suitable metal deposition process. Likewise, an electrically conductive layer 161 is formed over active surface 152 and recesses 158 of side surfaces 154 of semiconductor die 150*b*. Conductive layers 160-161 can be one or more layers of Al, Cu, Sn, Ni, Au, Ag, Ti, TiW, or other suitable electrically conductive material. Conductive layers 160-161 operate as inter-die contact areas electrically connected to the circuits on active surfaces 152 of semiconductor die 150*a*-150*b*, respectively.

Semiconductor die 150*a*-150*b* are brought together using a pick and place operation. Semiconductor die 150*a*-150*b* are positioned with extensions 156 covered with conductive layer 160 aligned with recesses 158 covered with conductive layer 161. Once extensions 156 are inserted into recesses 158, semiconductor die 150*a*-150*b* are securely interlocked. FIG. 5*c* shows a top view of extensions 156 covered with conductive layer 160 inserted into recesses 158 covered with conductive layer 161 and semiconductor die 150*a* interlocked with semiconductor die 150*b*. Side surface 154 of the base substrate material of semiconductor die 150*a* is in direct physical contact with side surface 154 of the base substrate material of semiconductor die 150*b*. Conductive layer 160 over extensions 156 of semiconductor die 150*a* makes electrical connection with conductive layer 161 on recesses 158 of semiconductor die 150*b* to provide greater contact surface area.

An electrically conductive material is deposited over the junction between conductive layer 160 on active surface 152 of semiconductor die 150*a* and conductive layer 161 on active surface 152 of semiconductor die 150*b*, using an evaporation, electrolytic plating, electroless plating, ball drop, or screen printing process. The conductive material can be Al, Sn, Ni, Au, Ag, Pb, Bi, Cu, solder, and combinations thereof, with an optional flux solution. For example, the conductive material can be eutectic Sn/Pb, high-lead solder, or lead-free solder. The conductive material is bonded to conductive layers 160-161 on active surfaces 152 of semiconductor die 150*a*-150*b* using a suitable attachment or bonding process. In one embodiment, the conductive material is reflowed by heating the material above its melting point to form interconnects 162. In some applications, Interconnects 162 are reflowed a second time to improve electrical contact to conductive layers 160-161. Interconnects 162 can also be compression bonded or thermo-compression bonded to conductive layers 160-161. The conductive material can be conductive epoxy that is cured using UV light or heat.

Interconnect 162 is formed across the junction between conductive layer 160 on active surface 152 of semiconductor die 150*a* and conductive layer 161 on active surface 152 of semiconductor die 150*b* to make electrical interconnect between the semiconductor die. During reflow, interconnect 162 may flow down conductive layers 160 and 161 on side surfaces 154 for a larger secure bond and to account for manufacturing tolerances. Interconnect 162 represent one type of interconnect that can be formed across conductive layers 160-161. The direct contact between extensions 156 and recesses 158 of semiconductor die 150*a*-150*b* allow for small inter-die interconnects between conductive layers 160-161 of semiconductor die 150*a*-150*b*, such as conductive paste, micro bump, printed solder, wire bond, sputtered film, evaporated film, conductive epoxy, ACF, or other minimal electrical interconnect.

Figure 6A:
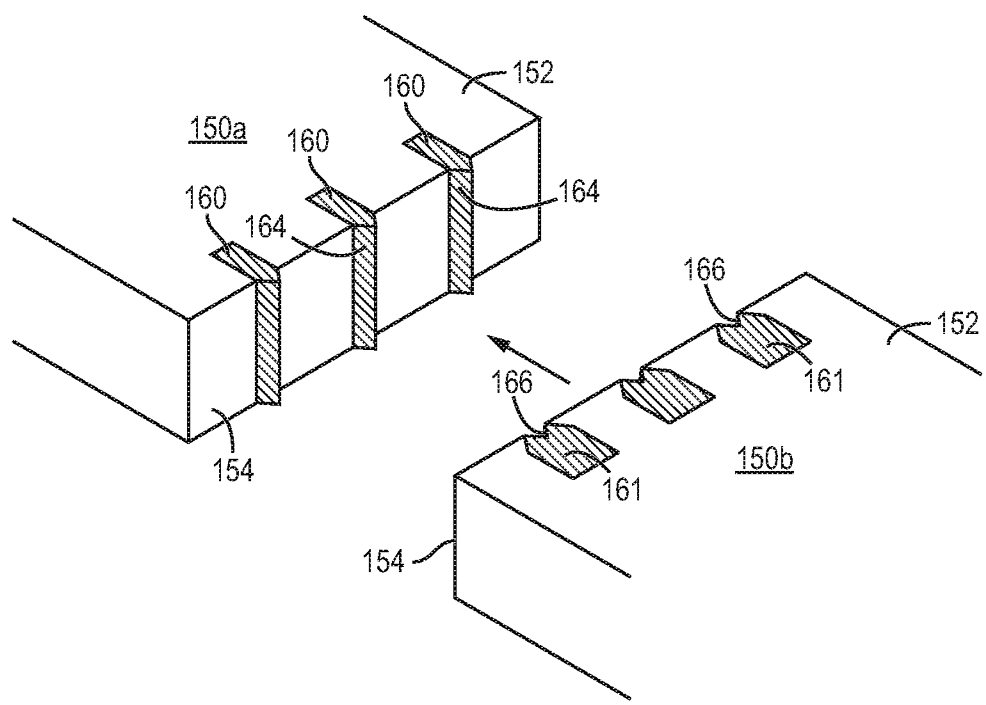
FIGS. 6*a*-6*b* illustrate forming conductive extensions and recesses with angled profiles on the side surfaces of the semiconductor die.

FIG. 6*a* shows an orthogonal view of another embodiment with extensions 156 having an angled profile 164 and recesses 158 having an opposite angled profile 166 for more secure interlocking. The precision plasma etching allows extensions 156 with angled profile 164 and recesses 158 with angled profile 166 to be formed with dimensions capable of closely and securely interlocking together. Plasma etching forms precision side surfaces of semiconductor die 104 with the angled-profile extensions 156 and angled-profile recesses 158, while retaining the structure and integrity of the base substrate material. Conductive layer 160 is formed over active surface 152 and the angled-profile extensions 156 of side surfaces 154 of semiconductor die 150*a* using PVD, CVD, electrolytic plating, electroless plating process, or other suitable metal deposition process. Likewise, an electrically conductive layer 161 is formed over active surface 152 and the angled-profile recesses 158 of side surfaces 154 of semiconductor die 150*b*.

Figure 6B:
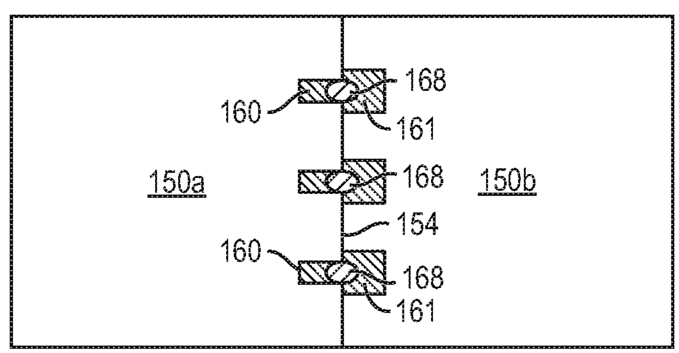

FIG. 6*b* is a top view of another embodiment with extensions 156 having angled profile 164 inserted into recesses 158 having opposite angled profile 166. Side surface 154 of the base substrate material of semiconductor die 150*a* is in direct physical contact with side surface 154 of the base substrate material of semiconductor die 150*b*. Conductive layer 160 over the angled-profile extensions 156 of semiconductor die 150*a* makes electrical connection with conductive layer 161 on the angled-profile recesses 158 of semiconductor die 150*b* to provide greater contact surface area. Interconnect 168 is formed across the junction between conductive layer 160 on active surface 152 of semiconductor die 150*a* and conductive layer 161 on active surface 152 of semiconductor die 150*b* to make electrical interconnect between the semiconductor die. During reflow, interconnect 168 may flow down conductive layers 160 and 161 on side surfaces 154 for a larger secure bond and to account for manufacturing tolerances. The interlocking feature with angled-profile extensions and angled-profile recesses can be formed on any side surface 154 of semiconductor die 150*a*-150*b*.

Figure 7A:
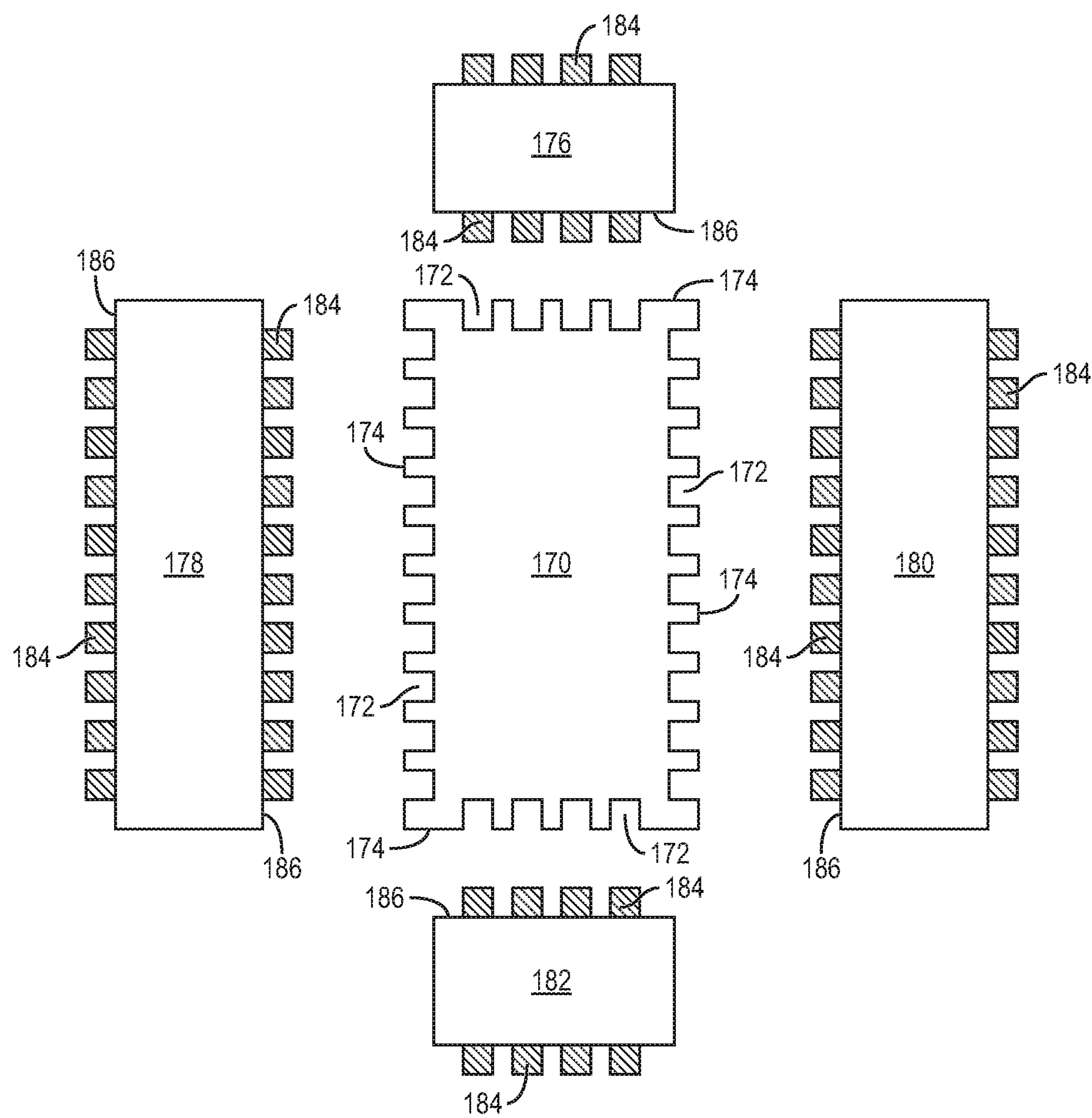
FIGS. 7*a*-7*b* illustrate an inter-die interconnect on multiple sides of semiconductor die with conductive extensions and recesses.
Figure 7B:
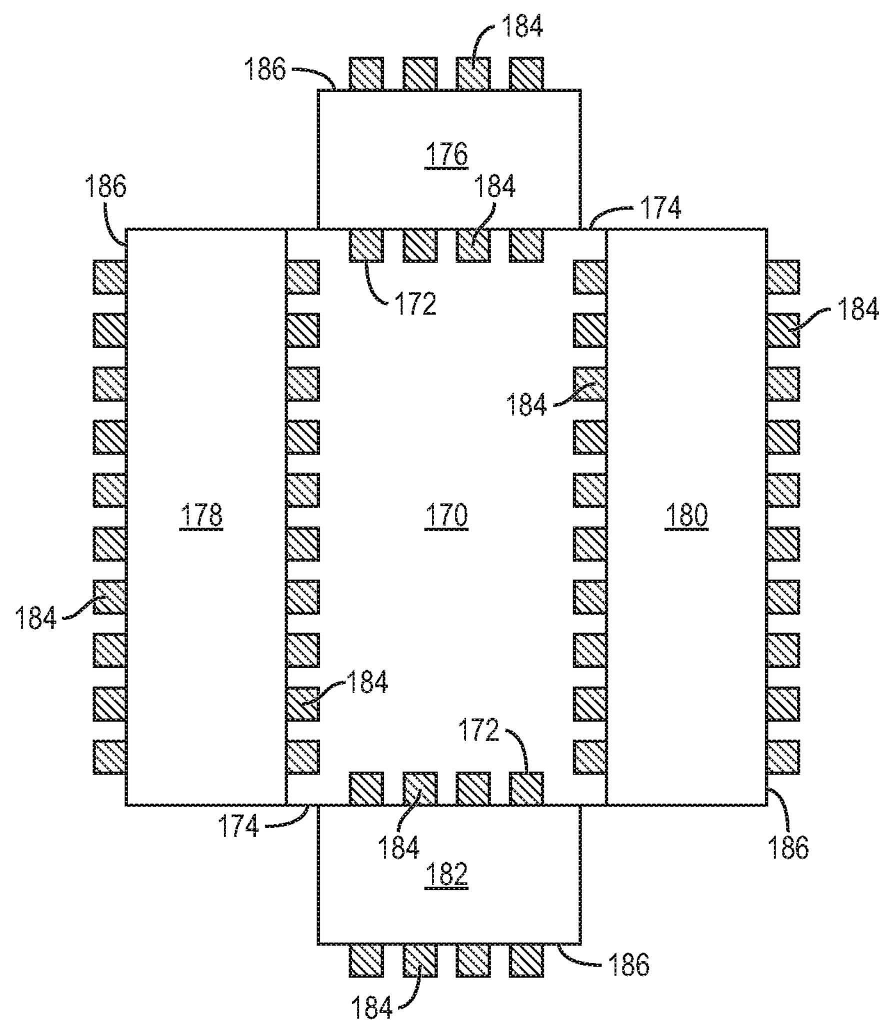

The interlocking feature can be formed on any side surface of the semiconductor die. FIG. 7*a* shows semiconductor die or substrate 170 with recesses 172 covered by a conductive layer formed on side surfaces 174, similar to FIG. 5*b*. Semiconductor die or substrates 176, 178, 180, and 182 each have extensions 184 covered by a conductive layer formed on side surfaces 186, similar to FIG. 5*b*. Extensions 184 of semiconductor die 176-182 insert into recesses 172 of semiconductor die 170. FIG. 7*b* show semiconductor die 176-182 contacting each side of semiconductor die 170 with the contact between extensions 184 covered by the conductive layer and recesses 172 covered by the conductive layer providing inter-die electrical interconnect.

Figure 8:
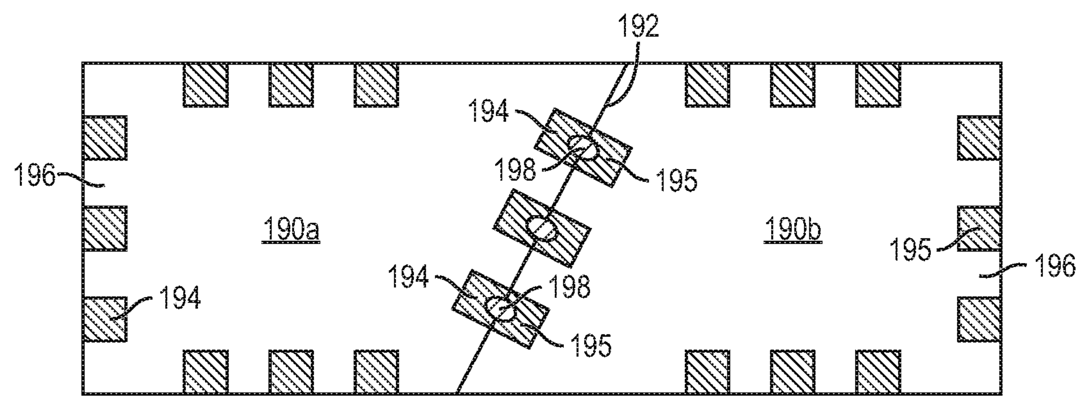
FIG. 8 illustrates an inter-die interconnect for semiconductor die having angled side surfaces.

FIG. 8 illustrates another embodiment of semiconductor die or substrates 190*a*-190*b* with angled side surfaces 192. Conductive layer 194 can be formed on active surface 196 of semiconductor die 190*a*, similar to FIGS. 3*a*-3*d*, and/or vertically down side surfaces 192, similar to FIG. 4*a*-4*b*. Likewise, conductive layer 195 can be formed on active surface 196 of semiconductor die 190*b*. Side surface 192 of the base substrate material of semiconductor die 190*a* is in direct physical contact with, or negligible separation from, side surface 192 of the base substrate material of semiconductor die 190*b*. Conductive layer 194 of semiconductor die 190*a* makes contact with, or negligible separation from, conductive layer 195 of semiconductor die 190*b*. Interconnect 198 is formed across the junction between conductive layer 194 on active surface 196 of semiconductor die 190*a* and conductive layer 195 on active surface 196 of semiconductor die 190*b* to make electrical interconnect between the semiconductor die. During reflow, interconnect 198 may flow down conductive layers 198 on side surfaces 192 for a larger secure bond and to account for manufacturing tolerances.

Figure 9:
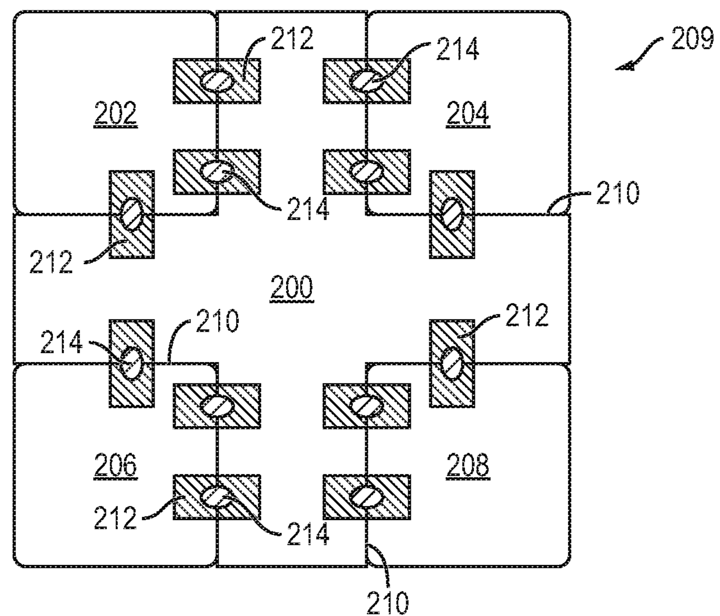
FIG. 9 illustrates an inter-die interconnect for multiple semiconductor die in a rectangular package.

FIG. 9 illustrates another embodiment of an inter-die interconnect arrangement with semiconductor die or substrate 200 having a cross or "+" form factor. Semiconductor die or substrates 202, 204, 206, and 208 are disposed within the L-shaped notches of the "+" form factor to make a rectangular semiconductor package 209. Conductive layer 212 can be formed on the active surfaces of semiconductor die 200-208, similar to FIGS. 3*a*-3*d*, and/or vertically down side surfaces 210, similar to FIGS. 4*a*-4*b*. Side surface 210 of the base substrate material of semiconductor die 200 is in direct physical contact with, or negligible separation from, side surface 210 of the base substrate material of semiconductor die 202-208. Conductive layer 212 of semiconductor die 200 makes contact with, or negligible separation from, conductive layer 212 of semiconductor die 202-208. Interconnects 214 are formed across the junction between conductive layer 212 on the active surface of semiconductor die 200 and conductive layer 212 on the active surface of semiconductor die 202-208 to make electrical interconnect between the semiconductor die. During reflow, interconnect 214 may flow down conductive layers 212 on side surfaces 210 for a larger secure bond and to account for manufacturing tolerances.

Figure 10:
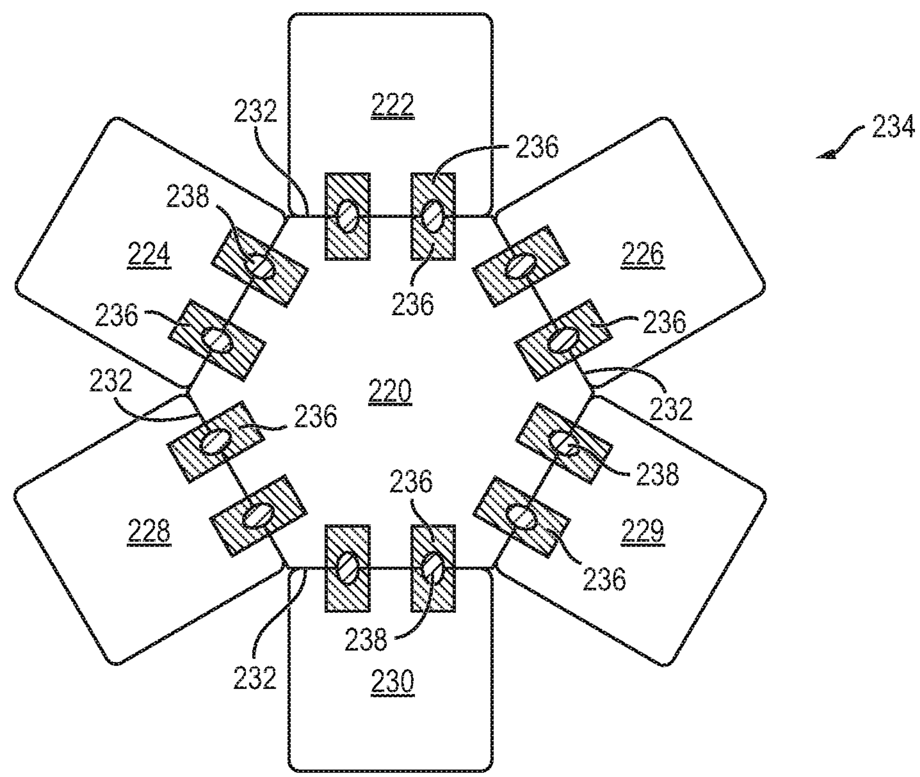
FIG. 10 illustrates an inter-die interconnect for multiple semiconductor die in a hexagonal package.

FIG. 10 illustrates another embodiment of an inter-die interconnect arrangement with semiconductor die or substrate 220 having a polygon form factor, e.g. hexagonal die. Semiconductor die or substrates 222, 224, 226, 228, 229, and 230 are disposed on each side surface 232 to make a star-shaped semiconductor package 234. Conductive layer 236 can be formed on the active surfaces of semiconductor die 222-230, similar to FIGS. 3*a*-3*d*, and/or vertically down side surfaces 232, similar to FIGS. 4*a*-4*b*. Side surface 232 of the base substrate material of semiconductor die 220 is in direct physical contact with, or negligible separation from, side surface 232 of the base substrate material of semiconductor die 222-230. Conductive layer 236 of semiconductor die 220 makes contact with, or negligible separation from, conductive layer 236 of semiconductor die 222-230. Interconnects 238 are formed across the junction between conductive layer 236 on the active surface of semiconductor die 220 and conductive layer 236 on the active surface of semiconductor die 222-230 to make electrical interconnect between the semiconductor die. During reflow, interconnect 238 may flow down conductive layers 236 on side surfaces 232 for a larger secure bond and to account for manufacturing tolerances. The polygon form factor of semiconductor die 220 increases the efficiency of the footprint or total usable area of the semiconductor package.

Figure 11:
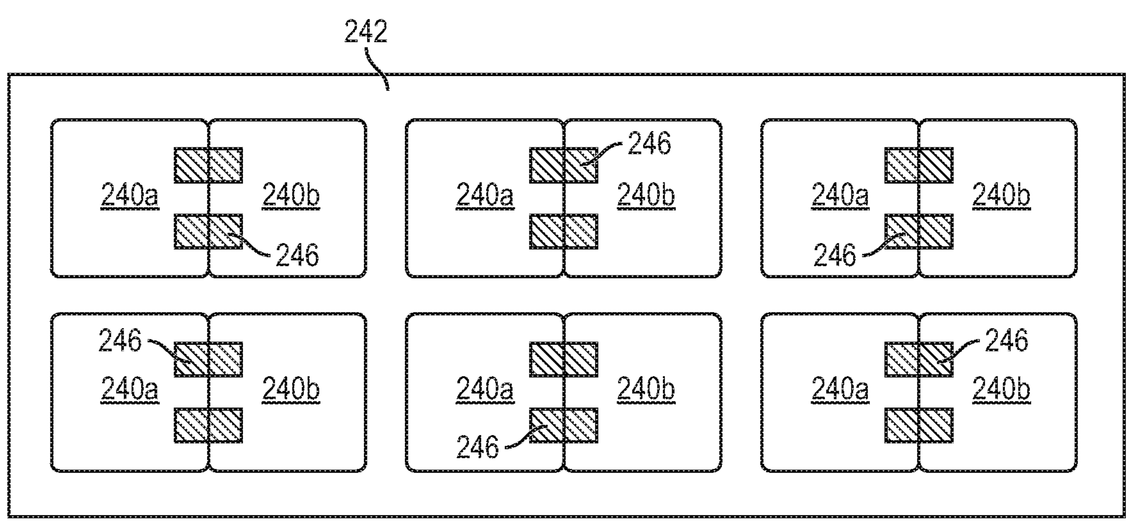
FIG. 11 illustrates an inter-die interconnect for pairs of semiconductor die on a substrate.

FIG. 11 illustrates another embodiment of an inter-die interconnect arrangement with pairings of semiconductor die or substrates 240*a*-240*b* disposed over substrate or leadframe 242. Side surface 244 of the base substrate material of semiconductor die 240*a* is in direct physical contact with, or negligible separation from, side surface 244 of the base substrate material of semiconductor die 240*b*. Conductive layer 246 can be formed on the active surfaces of semiconductor die 240*a*-240*b*, similar to FIGS. 3*a*-3*c*, and/or vertically down side surfaces 244, similar to FIGS. 4*a*-4*b*, using an electro-plating process. Conductive layer 246 spans semiconductor die 240*a*-240*b* to make electrical interconnect between the semiconductor die.

The inter-die interconnect arrangements, as described above, reduce semiconductor package dimensions and cost, and can be applied to most, if not all, semiconductor materials. The inductance and resistance is low compared to wire bonding between separate semiconductor die.

While one or more embodiments have been illustrated and described in detail, the skilled artisan will appreciate that modifications and adaptations to those embodiments may be made without departing from the scope of the present disclosure.

What is claimed:

1. A semiconductor device, comprising:

a first semiconductor die comprising an active surface and one or more side surfaces substantially perpendicular to the active surface;

an extension in each of the one or more side surfaces of the first semiconductor die;

a second semiconductor die comprising an active surface and a side surface substantially perpendicular to the active surface;

a recess in the side surface of the second semiconductor die;

a first conductive layer formed on a portion of the active surface and the extension in each of the one or more side surfaces of the first semiconductor die;

a second conductive layer formed on a portion of the active surface and the recess of the second semiconductor die; and an interconnect formed over the first conductive layer of the first semiconductor die and the second conductive layer of the second semiconductor die;

wherein the extension of the first semiconductor die is disposed into the recess in the second semiconductor die to interlock the first semiconductor die and second semiconductor die.

2. The semiconductor device of claim 1, wherein the interconnect includes a conductive material formed over a junction between the first conductive layer of the first semiconductor die and the second conductive layer of the second semiconductor die.

3. The semiconductor device of claim 1, wherein the first semiconductor die has more than four side surfaces.

4. The semiconductor device of claim 1, wherein the first semiconductor die includes a polygonal shape.

5. The semiconductor device of claim 1, wherein the extension has an angled profile and the recess has an angled profile.

6. The semiconductor device of claim 1, wherein the side surfaces are angled.

7. The semiconductor device of claim 1, further including a third semiconductor die comprising an active surface and a side surface substantially perpendicular to the active surface and comprising a third conductive layer comprised over a portion of the active surface and the side surface.

8. The semiconductor of claim 1, wherein the third semiconductor die is mechanically and electrically coupled to the first semiconductor die through the first conductive layer and the third conductive layer.

* * * * *